(12) United States Patent
Chen et al.

(10) Patent No.: US 7,178,093 B2
(45) Date of Patent: Feb. 13, 2007

(54) PRML SYSTEM WITH A BRANCH ESTIMATOR

(75) Inventors: Hong-Ching Chen, Feng Shan (TW); Wen-Zen Shen, deceased, late of Hsin Chu (TW); by Der-Tsuey Shen Wang, legal representative, Hsin Chu (TW)

(73) Assignee: MediaTek Inc., Hsin Chu (TW)

( * ) Notice: Subject to any disclaimer, the term of this patent is extended or adjusted under 35 U.S.C. 154(b) by 677 days.

(21) Appl. No.: 10/387,532

(22) Filed: Mar. 14, 2003

(65) Prior Publication Data

US 2003/0182618 A1    Sep. 25, 2003

(30) Foreign Application Priority Data

Mar. 22, 2002    (TW) .............................. 91105802 A

(51) Int. Cl.
*H03M 13/03*    (2006.01)
(52) U.S. Cl. ...................... 714/796; 714/791; 714/792; 714/794; 714/795; 375/262; 375/265; 375/341
(58) Field of Classification Search ........ 714/794–796, 714/791–792; 375/262, 265, 341
See application file for complete search history.

(56) References Cited

U.S. PATENT DOCUMENTS

| | | | | |
|---|---|---|---|---|
| 5,444,721 A | * | 8/1995 | Okanoue et al. ............ 714/794 |
| 5,742,622 A | * | 4/1998 | Claydon et al. ............ 714/789 |
| 5,870,433 A | * | 2/1999 | Huber et al. ................ 375/233 |
| 5,905,764 A | * | 5/1999 | Watanabe et al. ........... 375/341 |
| 5,995,562 A | * | 11/1999 | Koizumi ..................... 375/341 |
| 6,216,249 B1 | * | 4/2001 | Bliss et al. .................. 714/792 |

OTHER PUBLICATIONS

Jaekyun Moon et al.'Pattern-dependent noise prediction in signal-dependent noise,' IEEE Journal on Selected Areas in Communications, Publication Date: Apr. 2001, vol. 19, Issue: 4, On pp. 730-743.*

* cited by examiner

*Primary Examiner*—Guy J. Lamarre
(74) *Attorney, Agent, or Firm*—Birch, Stewart, Kolasch & Birch, LLP

(57) ABSTRACT

A PRML system with a branch estimator. The PRML system includes an analog-to-digital converter (ADC) for receiving an analog input signal and converting the analog input signal into a digital sampled signal according a sampling clock; a branch estimator for receiving the digital sampled signal and estimating each branch eigenvalue; and a Viterbi decoder for decoding an output signal according to the digital sampled signal and the branch eigenvalues. Since the PRML system employs the branch estimator to estimate the branch eigenvalues of trellis of the Viterbi decoder directly, the PRML system can be simplified and the execution speed of the PRML system can be increased.

23 Claims, 9 Drawing Sheets

PRML SYSTEM WITH A BRANCH ESTIMATOR

BACKGROUND OF THE INVENTION

1. Field of the Invention

The invention relates generally to a PRML (Partial Response Maximum Likelihood) system, and in particular to a PRML system with a branch estimator and a tunable Viterbi decoder.

2. Description of the Related Art

A PRML (Partial Response Maximum Likelihood) system is used to retrieve EFM (Eight-to-Fourteen Modulation) signals of CD (Compact Disc)/DVD (Digital Versatile Disk) more reliably, and a Viterbi decoder is usually to realize the maximum likelihood detection in the PRML system. In practice, the PRML system handles the channels that are uncertain and varying, and two conventional methods are proposed to solve this problem in the PRML system.

FIG. 1 is a block diagram showing a PRML system with an adaptive equalizer according to a first conventional method. As shown in FIG. 1, the PRML system 10 includes an adaptive equalizer 11 and a Viterbi decoder 12. The Viterbi decoder 12 has to receive constant parameters, and the adaptive equalizer 11 is used to reshape the waveform of the input signal to fit the requirement of the Viterbi decoder 12. Then, the Viterbi decoder 12 can generate the output signal. FIG. 2 is a block diagram showing a PRML system with a channel estimator according to a second conventional method. As shown in FIG. 2, the PRML system 20 includes a Viterbi decoder 21 and a channel estimator 22. The Viterbi decoder 21 receives an input signal and generates an output signal. The Viterbi decoder 21 may receive tunable parameters, and the channel estimator 22 is used to estimate and tune the desired parameters needed by the Viterbi decoder 21 according to the input signal. Then, the Viterbi decoder 21 can generate the output signal according to the tuned parameters and the input signal.

Currently, the PRML system 10 of the first method is widely used. However, the adaptive equalizer 11 thereof needs an adaptive filter (equalizer 11) to process the waveform of the input signal, thereby needing a lot of hardware and the execution speed being limited. Although an adaptive filter with pipeline architecture can increase the speed, the pipelining latency of the equalized signal may suffer the problem of system un-stability.

Another problem of the conventional PRML system is that the performance of the PRML system is reduced with the phase error of the sampling clock. In the conventional data slicing method, the sliced signal is in the binary form, which means that the channel clock has large tolerance of phase error to latch the sliced signal correctly. However, the sampling clock in the PRML system is more critical than the channel clock required in the data slicing method, because any small phase error may generate a magnitude error of the sampled value. In addition, the sampling clock in the PRML system is used to trigger an ADC (Analog-to-Digital converter), and the performance of the high speed ADC is very sensitive to the jitter of the sampling clock.

A feature of a clock recovery for the PRML system is that the sampling clock has to be synchronized with the output signal (sampled data) of ADC, rather than the input signal. That is, the phase error is estimated from the sampled data instead of the input signal. FIGS. 3 and 4 show two PRML systems with different clock recovery block diagrams, respectively. As shown in FIG. 3, the PRML system utilizes a clock recovery unit 33, which receives the output signal of the adaptive equalizer 11, to provide a sampling clock to the ADC 32. An analog signal equalizer 31 is further provided in front of the ADC 32 to receive and equalize an input signal. The PRML system as shown in FIG. 4 provides a sampling clock with fixed frequency to the ADC 32, and resample the output of the ADC 32 at the desired sample phases with a digital signal equalizer and timing interpolation unit 41.

FIG. 5 is a block diagram showing a typical adaptive channel estimator applied in the PRML system of FIG. 2. The channel estimator includes a channel 51, a FIR (Finite Impulse Response) filter 52, an adaptive weighting controller 53, and an adder 54. The channel estimator utilizes the FIR filter 52 to find out the characteristic of the channel 51, which is called as a model-directed estimator accordingly. In general, to implement the FIR filter 52 requires multipliers, which limits the operation speed. Meanwhile, the channel estimator finds out the channel model of the channel (i.e., linear channel coefficients), so an additional circuit (not shown) has to be used to convert the channel coefficients of the channel model into branch values required by the Viterbi decoder during decoding. Therefore, the adaptive channel estimator is inefficient and also needs many redundant circuits.

SUMMARY OF THE INVENTION

In view of the above-mentioned problems, an object of the invention is to provide a PRML system using a trellis-directed branch estimator, so as to directly estimate the branch value needed by the trellis of the Viterbi decoder in the PRML system.

To achieve the above-mentioned object, a PRML system of the invention includes an analog-to-digital converter, a branch estimator and a Viterbi decoder. The analog-to-digital converter receives an analog input signal, and converts the analog input signal into a digital sampled signal according to a sampling clock. The branch estimator receives the digital sampled signal and estimates a plurality of branch eigenvalues. The decoder receives the digital sampled signal and the branch eigenvalues and then decodes the digital sampled signal to generate an output signal.

The branch estimator includes a de-multiplexer and a plurality of branch eigenvalue calculating units. The de-multiplexer receives the digital sampled signal and the branch eigenvalues, and outputs the data of the digital sampled signal to one of the branch eigenvalue calculating units according to the branch eigenvalues. The plurality of branch eigenvalue calculating units receive the data of the digital sampled signal output from the de-multiplexer, and calculate the branch eigenvalues of each branch, respectively.

Since the PRML system employs a branch estimator to estimate the branch value of trellis of the Viterbi decoder directly, the PRML system can be simplified and the execution speed of the PRML system can be increased.

DETAILED DESCRIPTION OF THE INVENTION

The PRML system with a branch estimator of the invention will be described with reference to the accompanying drawings.

Figure 6:
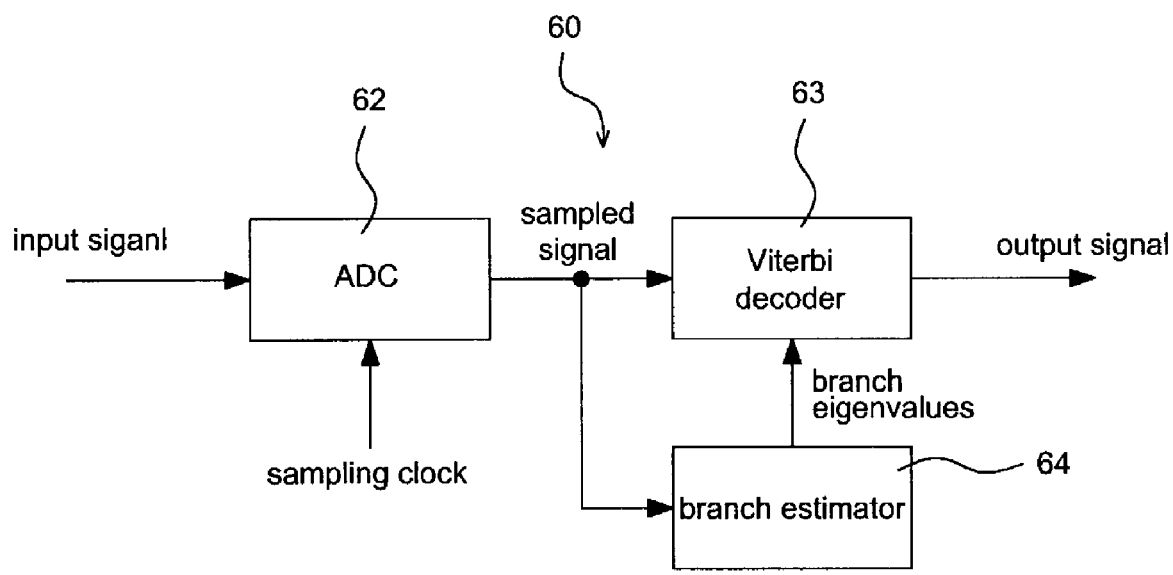
FIG. 6 is a block diagram showing a PRML system with a branch estimator according to a first embodiment of the invention.

FIG. 6 is a block diagram showing a PRML system with a branch estimator according to a first embodiment of the invention. Referring to FIG. 6, the PRML system 60 includes an ADC (Analog-to-Digital Converter) 62, a Viterbi decoder 63, and a branch estimator 64. The branch estimator 64 used in the PRML system of the invention is different from a typical channel-model-directed estimator. The branch estimator 64 is a so-called trellis-directed branch estimator. The branch estimator 64 can directly estimate the branch eigenvalues, rather than the channel coefficients of the model, which is needed by the trellis used in the Viterbi decoder 63. Hence, the branch estimator 64 does not need additional circuits to convert the channel coefficients into the branch eigenvalues for Viterbi decoding.

The ADC 62 receives the input signal and converts into digital sampled signal. The branch estimator 64 receives the digital sampled signal and estimates the branch eigenvalues needed by the Viterbi decoder 63, which are with respect to transitions between any two states in the trellis of Viterbi decoding. The Viterbi decoder 63 receives the digital sampled signal and branch eigenvalues and decodes the digital sampled signal based on the branch eigenvalues to generate the output signal.

Figures 7A, 7B:
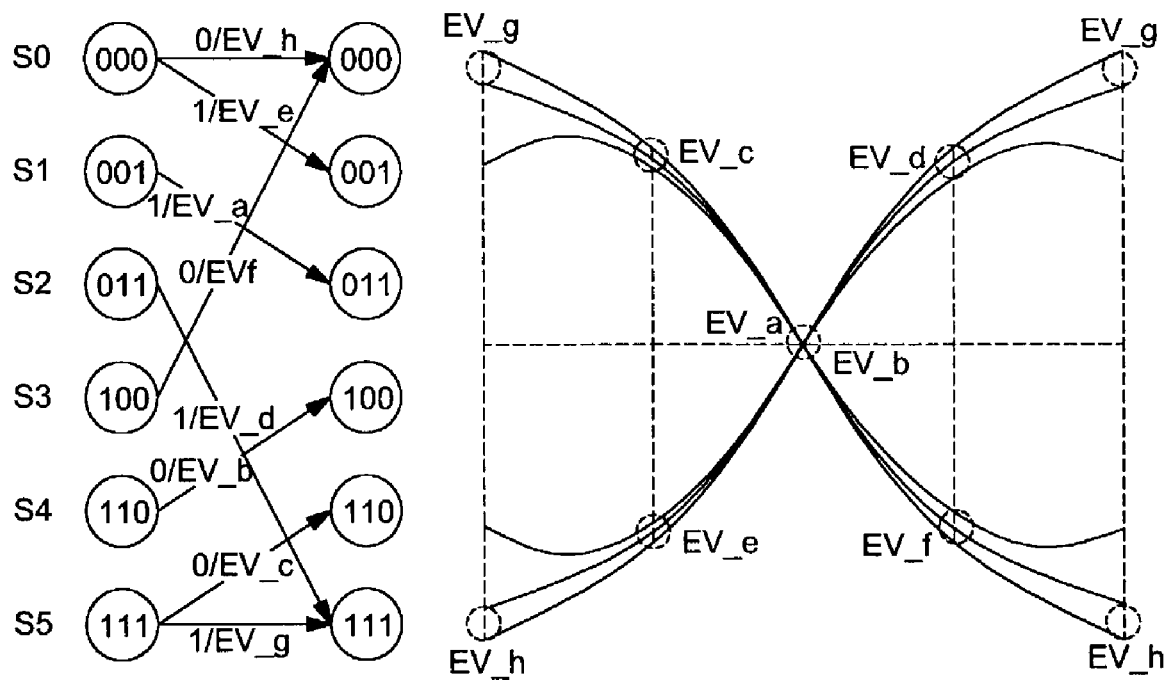
FIG. 7(A) shows the trellis for decoding the EFM signals using a Viterbi decoder.
FIG. 7(B) shows the branch value distribution of the trellis for decoding the EFM signals using a Viterbi decoder.

FIG. 7(A) shows the trellis of the EFM (Eight-to-Fourteen Modulation) signals for decoding an optical disc system using a Viterbi decoder in a PRML system, and FIG. 7(B) shows the branch eigenvalues thereof. As shown in the drawings, the trellis of the EFM signals includes six states labeled as S0(000), S1 (001), S2(011), S3(100), S4(110), and S5(111) owing to the characteristic of minimum Run-Length Limit for the EFM signals. In addition, according to the states of the trellis, the Viterbi decoder 63 needs eight branch eigenvalues as follows:

a first eigenvalue EV_a, when the digital sampled signal is decreasing gradually to about 0 or the average value of the digital sampled signal at the center of the falling transition duration of the digital sampled signal;

a second eigenvalue EV_b, when the digital sampled signal is increasing gradually to about 0 or the average value of the digital sampled signal at the center of the rising transition duration of the digital sampled signal;

a third eigenvalue EV_c, when the digital sampled signal is decreasing gradually to about ½ positive peak value or the average value of the digital sampled signal earlier a period of the sampled clock than the center of the falling transition duration of the digital sampled signal;

a fourth eigenvalue EV_d, when the digital sampled signal is increasing gradually to about ½ positive peak value or the average value of the digital sampled signal later a period of the sampled clock than the center of the rising transition duration of the digital sampled signal;

a fifth eigenvalue EV_e, when the digital sampled signal is decreasing gradually to about ½ negative peak value or the average value of the digital sampled signal later a period of the sampled clock than the center of the falling transition duration of the digital sampled signal;

a sixth eigenvalue EV_f, when the digital sampled signal is increasing gradually to about ½ negative peak value or the average value of the digital sampled signal earlier a period of the sampled clock than the center of the rising transition duration of the digital sampled signal;

a seventh eigenvalue EV_g, when the digital sampled signal is about a positive peak value, the average value of the digital sampled signal later two periods of the sampled clock than the center of the rising transition duration of the digital sampled signal, or the average value of the digital sampled signal earlier two periods of the sampled clock than the center of the falling transition duration of the digital sampled signal; and an eighth eigenvalue EV_h, when the digital sampled signal is about a negative peak value, the average value of the digital sampled signal later two periods of the sampled clock than the center of the falling transition duration of the digital sampled signal, or the average value of the digital sampled signal earlier two periods of the sampled clock than the center of the rising transition duration of the digital sampled signal.

The Viterbi decoder 63 can decode the digital sampled signal (EFM signal) according to the eight branch eigenvalues of FIG. 7(B) and the trellis of FIG. 7(A). For example, when the state of the trellis is S0(000) and the branch eigenvalue is EV_e, the next state will change to S1(001); when the state of the trellis is S1(001) and the branch eigenvalue is EV_a, the next state will change to S2(011); when the state of the trellis is S2(011) and the branch eigenvalue is EV_d, the next state will change to S5(111), and so on.

Figure 1:
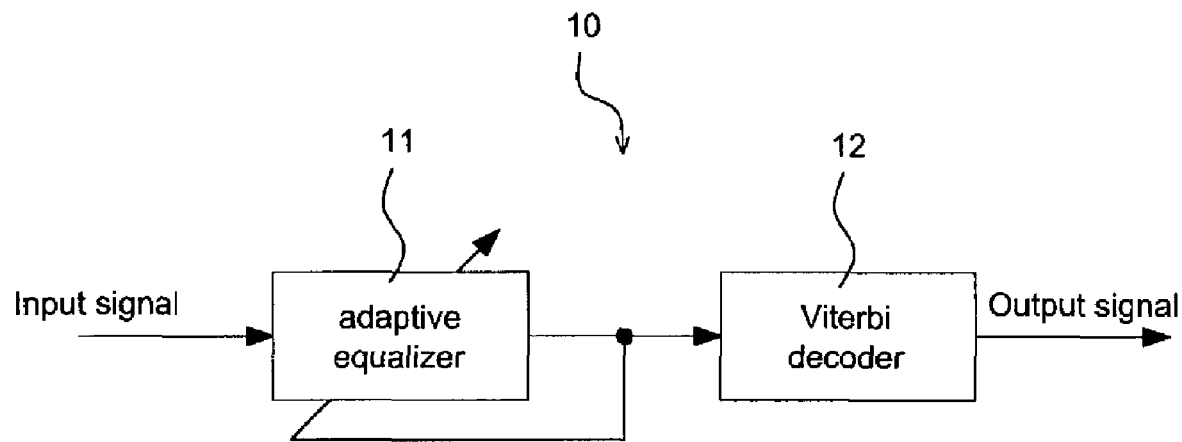
FIG. 1 is a block diagram showing a conventional PRML system with an adaptive equalizer.
Figure 2:
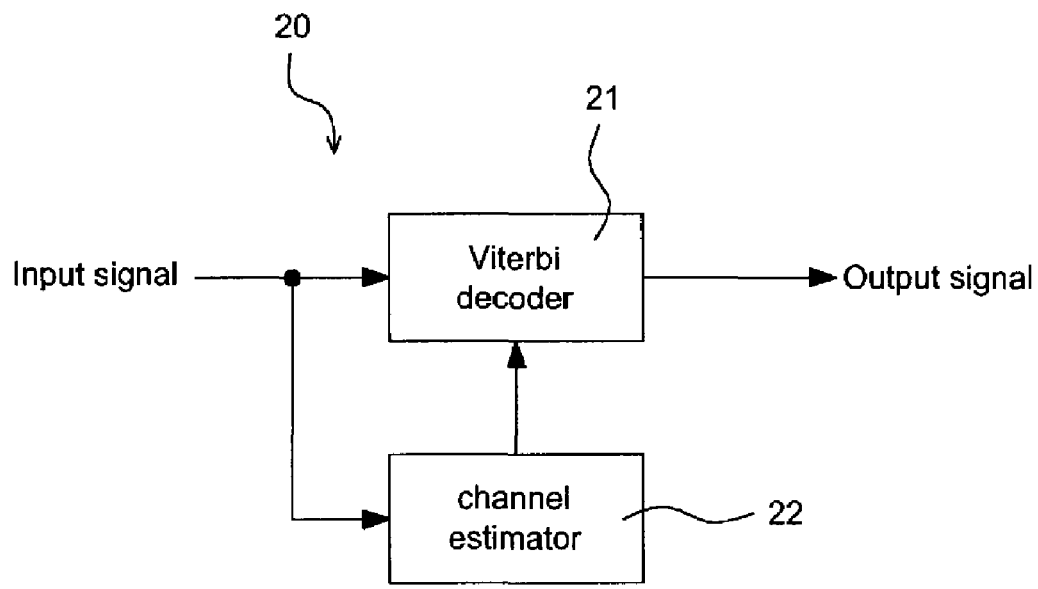
FIG. 2 is a block diagram showing a conventional PRML system with a channel estimator.
Figure 3:
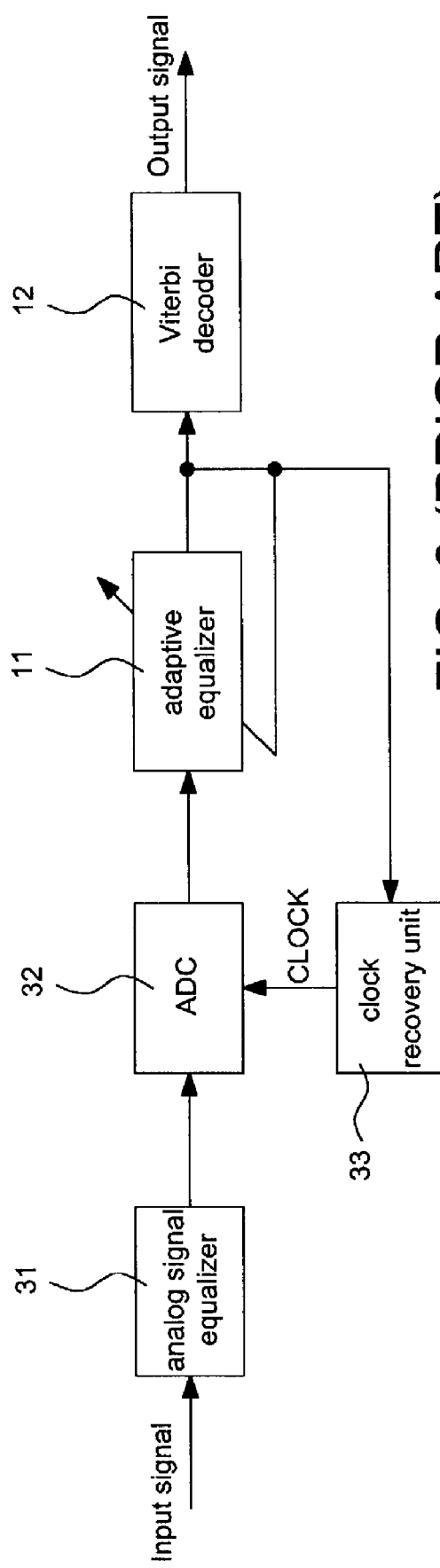
FIG. 3 is a block diagram showing a conventional PRML system with clock recovery.
Figure 4:
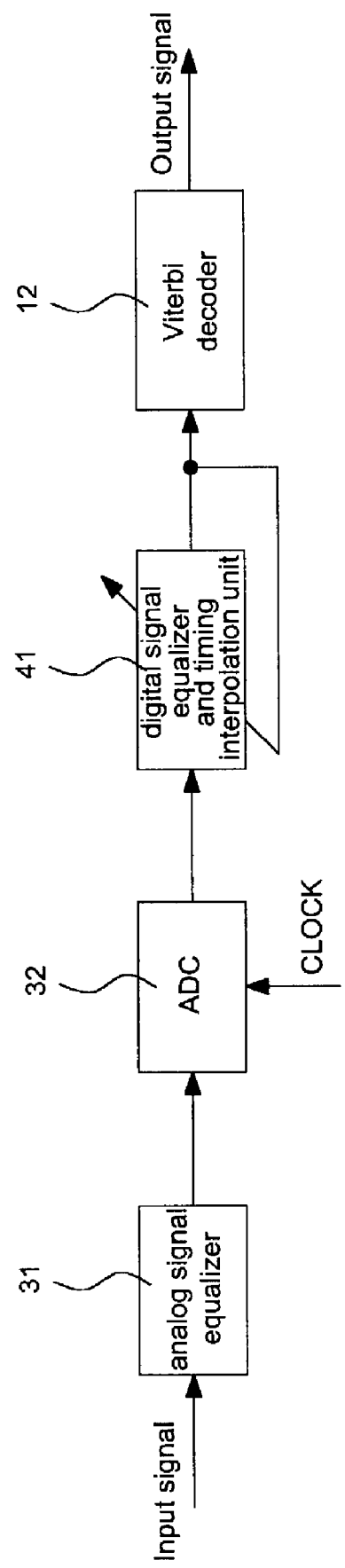
FIG. 4 is a block diagram showing a conventional PRML system with timing interpolation unit.
Figure 5:
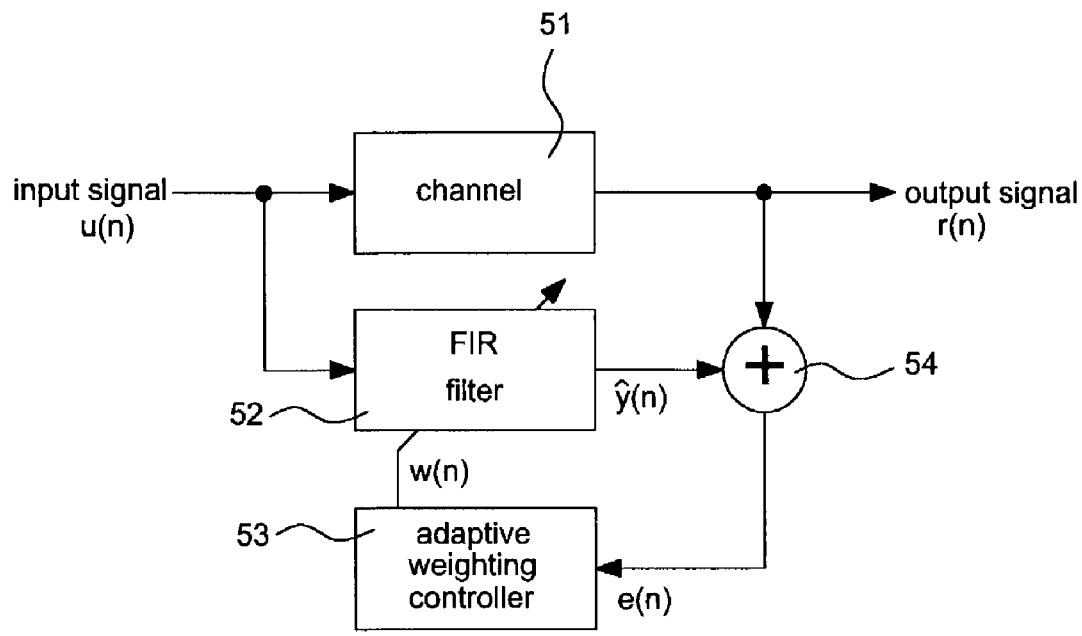
FIG. 5 is a block diagram showing a typical adaptive channel estimator applied in the PRML system of FIG. 2.

The PRML system 60 of the invention does not employ an adaptive equalizer as shown in FIG. 1. Thus, the branch eigenvalues needed by the Viterbi decoder 63 are not fixed. Instead, the PRML system 60 of the invention uses a branch estimator 64 to estimate the branch eigenvalues directly and outputs the branch eigenvalues to the Viterbi decoder 63. As the estimation of the branch eigenvalues gets more precisely, the decoding of the Viterbi decoder 63 gets more precisely. The branch estimator 64 of the PRML system 60 in this invention is used to estimate the desired branch eigenvalues for the Viterbi decoder 63. The branch estimator 64 is different from the typical model-directed channel estimator. The branch estimator 64 is a so-called trellis-directed branch estimator. The branch estimator 64 can directly estimate the branch eigenvalues needed in the trellis, rather than the channel coefficients of the model. Consequently, the branch estimator 64 does not need additional circuits to convert the channel coefficients into the branch eigenvalues for Viterbi decoding.

Figure 8:
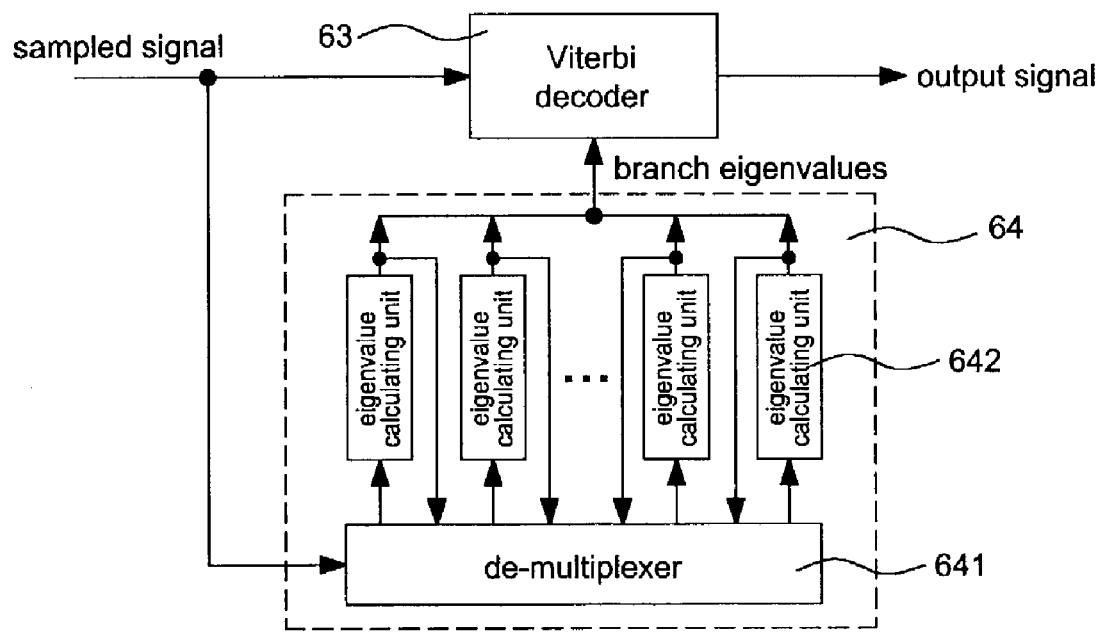
FIG. 8 is a block diagram showing the branch estimator in the FIG. 6 of the invention.

FIG. 8 is a block diagram of the branch estimator in the FIG. 6. Referring to FIG. 8, the branch estimator 64 includes a de-multiplexer 641 and a plurality of eigenvalue calculating units 642. The de-multiplexer 641 receives the data of the digital sampled signal and eigenvalues from the eigenvalue calculating units 642, and outputs the data to one of the eigenvalue calculating units 642 in which the branch eigenvalues is most close to the data. The decreasing or increasing trend of the digital sampled signal is also considered when outputting the data to one of the eigenvalue calculating units 642. According to the received data, each eigenvalue calculating unit 642 calculates the eigenvalue by a statistic method, such as a least mean square or an average value, and outputs the eigenvalue to the Viterbi decoder 63 and the de-multiplexer 641. When the system starts, each eigenvalue calculating unit 642 has a preset initial eigenvalue. The eigenvalue calculating units 642 can assign different calculating weights to the received data when calculating the eigenvalues. For example, the later received data is assigned a higher calculating weight for enhancing its effect to the eigenvalue, which makes that the branch estimator 64 can estimate each branch eigenvalue quickly and precisely.

Figure 9:
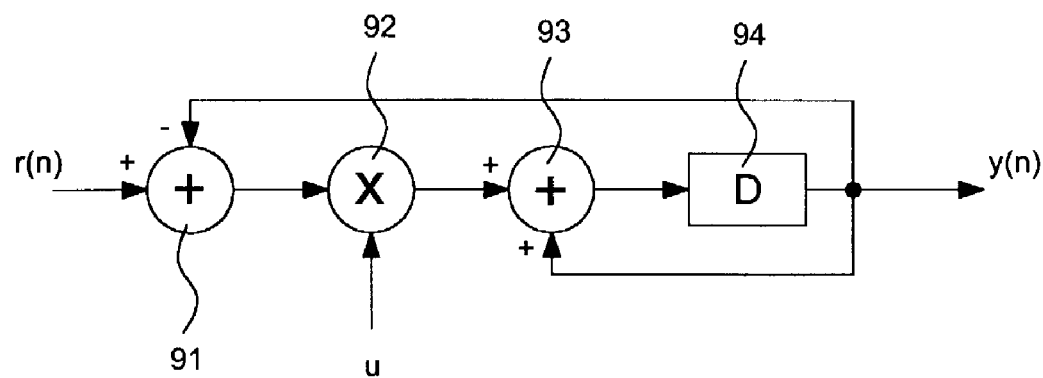
FIG. 9 shows one example of the eigenvalue calculating unit.

FIG. 9 shows one example of the eigenvalue calculating unit. As shown in FIG. 9, the eigenvalue calculating unit 642 includes two adders 91, 93, a multiplier 92, and a register D 94 to realize the following algorithm for calculating the eigenvalue:

$$y(n)=y(n-1)+u*(r(n)-y(n-1)) \quad (1)$$

where n is the index of the sampling clock, r(n) is the received data, y(n−1) is the present eigenvalue, y(n) is the new eigenvalue, and u is a weighted value. The weighted value u can be a constant and be selected as a power of 2, so that the multiplier may be implemented with a bit shifter to speed up the calculation. In addition, since each data of the digital sampled signal is distributed to the eigenvalue calculating units 642 via the de-multiplexer 641, the amount of received data for a single eigenvalue calculating unit 642 is reduced and the speed requirement of the eigenvalue calculating unit 642 is also reduced.

Figure 10:
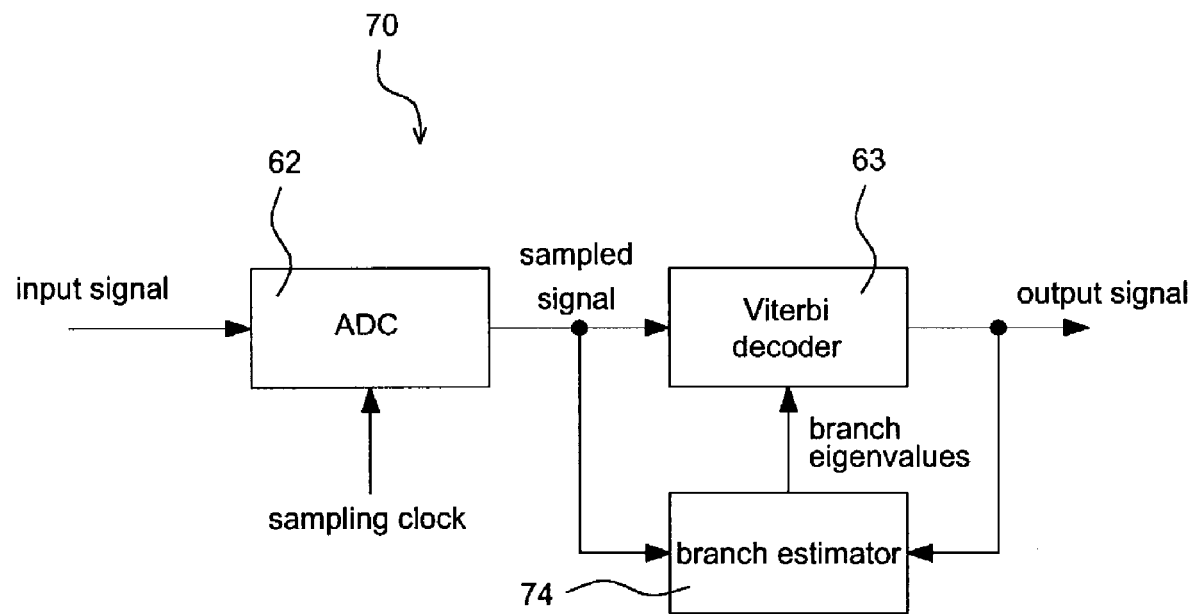
FIG. 10 is a block diagram showing a PRML system with a branch estimator according to a second embodiment of the invention.

FIG. 10 is a block diagram showing a PRML system with a branch estimator according to a second embodiment of the invention. As shown in the drawing, the PRML system 70 includes an ADC 62, a Viterbi decoder 63, and a branch estimator 74. The PRML system 70 of this embodiment is similar to the PRML system 60 of the first embodiment, except for only one difference that the branch estimator 74 receives the output signal from the Viterbi decoder 63. Since the Viterbi decoder 63 has decoded the signal, the circuit of the branch estimator 74 may be simplified using the output signal from the Viterbi decoder 63.

Figure 11:
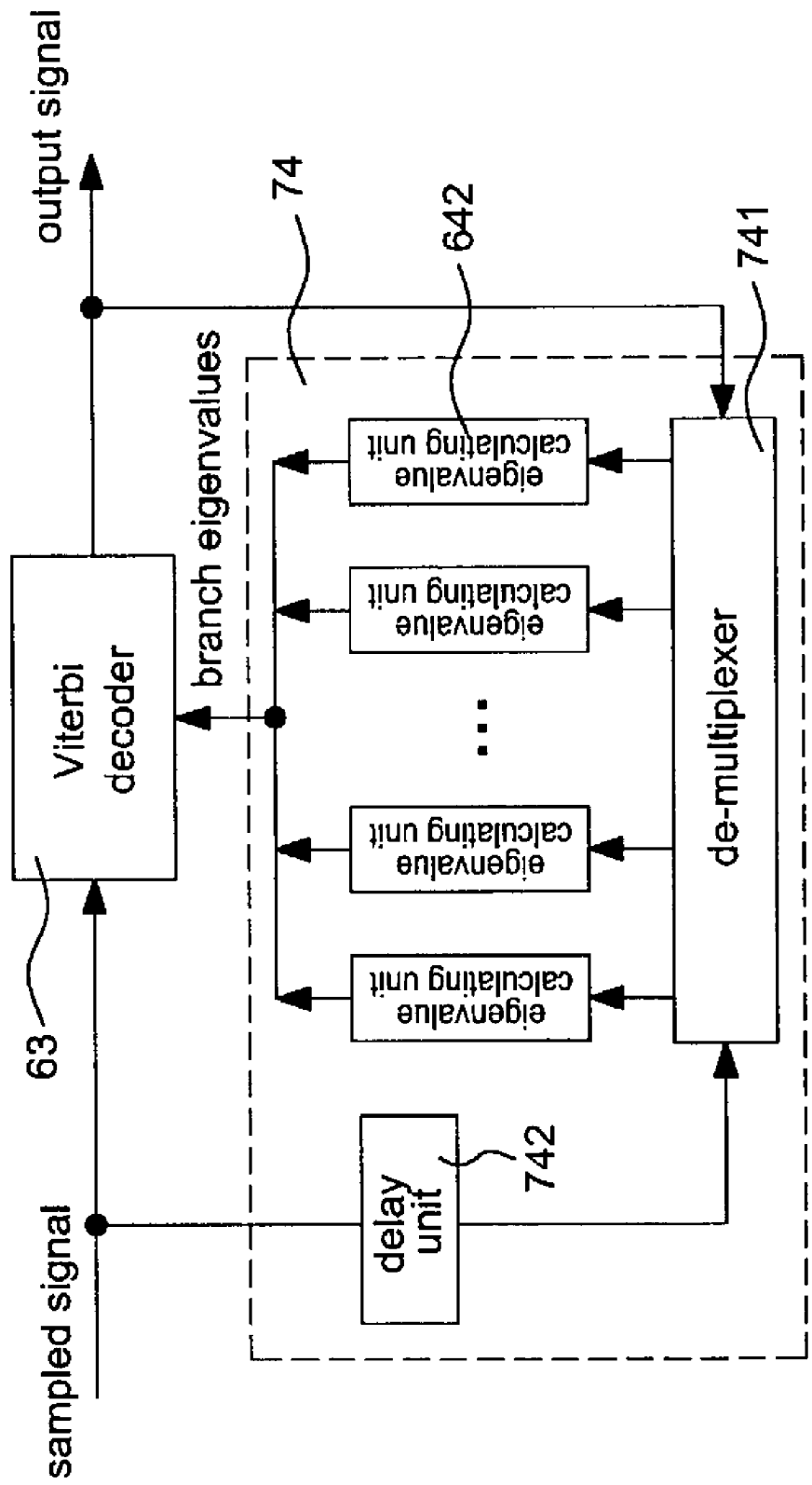
FIG. 11 is a block diagram showing the branch estimator in the FIG. 10 of the invention.

FIG. 11 is a block diagram showing the branch estimator of FIG. 10. Referring to FIG. 11, the branch estimator 74 includes a de-multiplexer 741, a delay unit 742, and a plurality of eigenvalue calculating units 642. The de-multiplexer 741 receives the data of the digital sampled signal delayed by the delay unit 742 and the output signal from the Viterbi decoder 63, and outputs each data to one of the eigenvalue calculating units 642 according to the output signal. Since it takes time for the Viterbi decoder to decode the digital sampled signal, the delay unit 742 is used to delay the digital sampled signal with some delay time to make the digital sampled signal received by the de-multiplexer 741 be synchronized with the output signal from the Viterbi decoder 63. Consequently, the de-multiplexer 741 can output the data to a proper eigenvalue calculating unit 642 according to the status variation of the output signal of the Viterbi decoder 63. Taking the trellis of FIG. 7 as an example, if the status of the output signal changes from S0 to S1, it means that the sampled signal has to be outputted to the eigenvalue calculating unit with the fifth eigenvalue EV_e; if the status of the output signal changes from S2 to S5, it means that the sampled signal has to be outputted to the eigenvalue calculating unit with the fourth eigenvalue EV_d, and so on.

Figure 12:
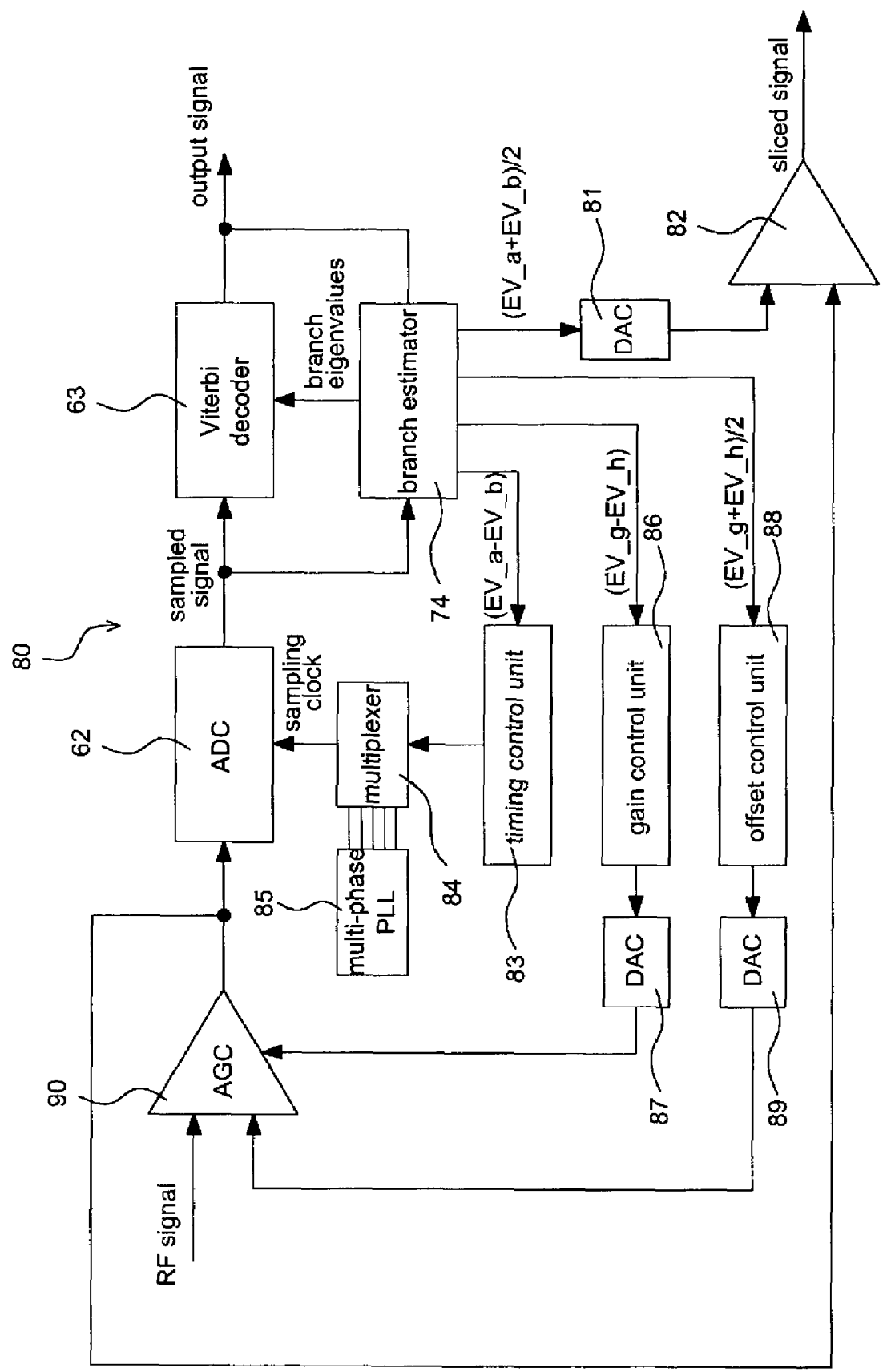
FIG. 12 is a block diagram showing a PRML system with a branch estimator according to a third embodiment of the invention.

FIG. 12 is a block diagram showing a PRML system with a branch estimator according to a third embodiment of the invention. Referring to FIG. 12, the PRML system 80 includes an ADC 62, a Viterbi decoder 63, a branch estimator 74, a first DAC (Digital-to-Analog Converter) 81, a slicer 82, a timing control unit 83, a multiplexer 84, a multi-phase PLL (Phase Locked Loop) 85, a gain control unit 86, a second DAC 87, an offset control unit 88, a third DAC 89, and an AGC (auto gain controller) 90.

Because the branch estimator 74 in the PRML system 80 has estimated eight branch eigenvalues, including the first eigenvalue EV_a, the second eigenvalue EV_b, the third eigenvalue EV_c, the fourth eigenvalue EV_d, the fifth eigenvalue EV_e, the sixth eigenvalue EV_f, the seventh eigenvalue EV_g, and the eighth eigenvalue EV_h, the other control units in the PRML system 80 can obtain the desired information from these branch eigenvalues. For example, when the PRML system 80 wants to produce a sliced signal (or sliced output), an average of the first eigenvalue EV_a and the second eigenvalue EV_b can be used as a slicing level. Then, the first DAC 81 converts the average into an analog comparison level for the digital slicer 82. Then, the digital slicer 82 can slice the input signal into a sliced signal.

In addition, the PRML system 80 with a branch estimator of the invention uses the timing control unit 83, the multi-phase PLL 85, and the multiplexer 84 to generate a sampling clock needed by the ADC 62 for reducing the phase error of the sampling clock. When the first eigenvalue EV_a equals to the second eigenvalue EV_b, it means no phase error of the sampling clock exists. Otherwise, when the first eigenvalue EV_a does not equal to the second eigenvalue EV_b, it means that a phase error exists. Thus, according to the difference between the first eigenvalue EV_a and the second eigenvalue EV_b, the timing control units 83 generates a control signal to control the multiplexer 84 to output a correct sampling clock. Because the timing control units 83, multi-phase PLL 85, and multiplexer 84 are well known, detailed description thereof will be omitted.

Next, the PRML system 80 with the branch estimator of the invention may further uses the gain control unit 86 and the second DAC 87 to control the gain of the AGC 90, so as to tune the amplitude of the input signal of the ADC 62 to a predetermined range.

Figure 13A:
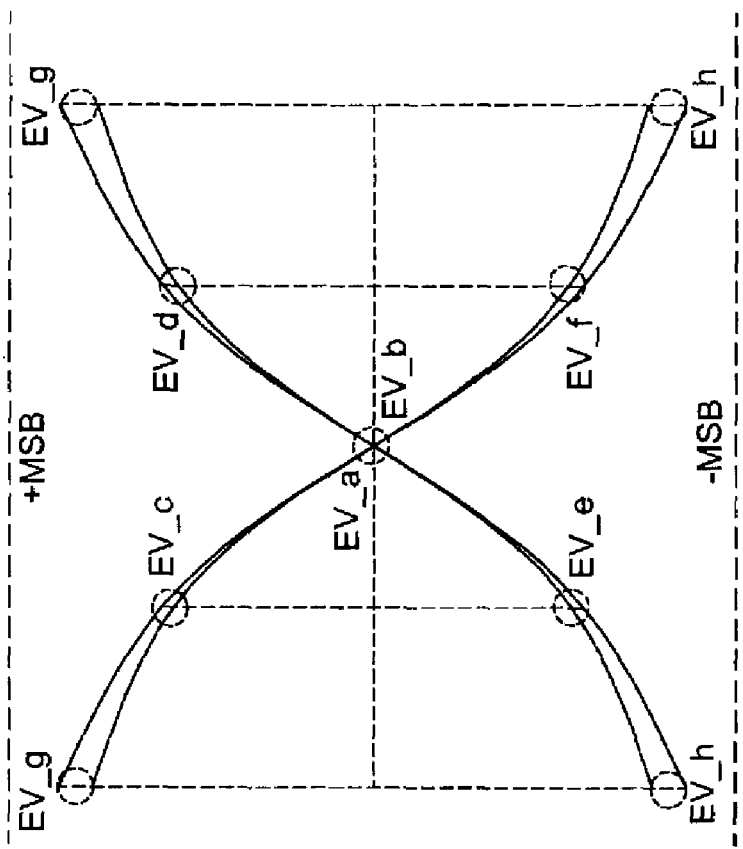
FIG. 13(A) shows the branch eigenvalues with too large AGC gain.
Figure 13B:
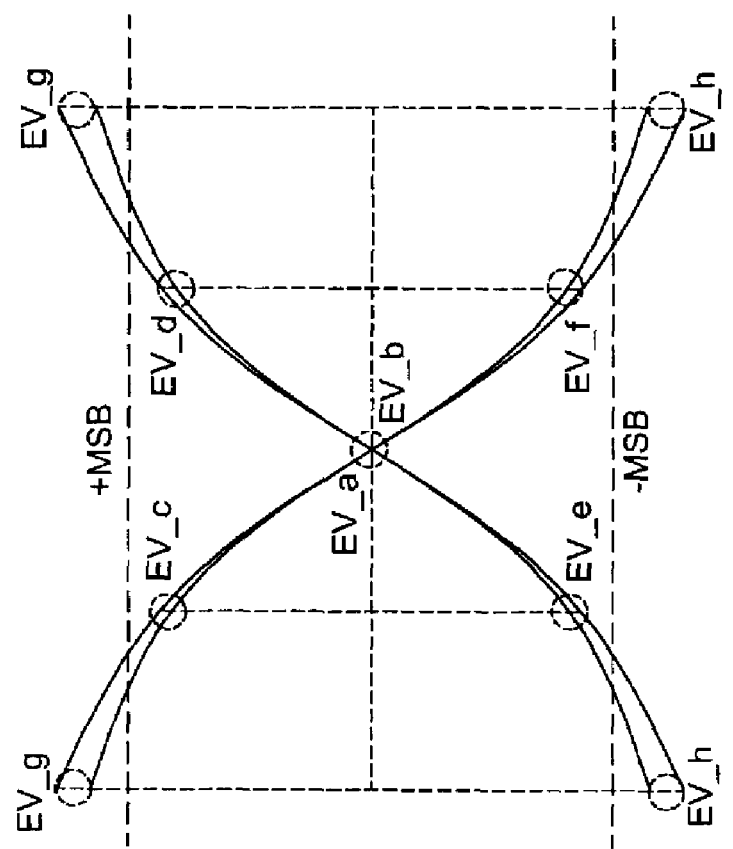
FIG. 13(B) shows the branch eigenvalues with too small AGC gain.

FIG. 13(A) shows the branch eigenvalues with too large AGC gain, in which "+MSB" between "−MSB" is the predetermined range for AGC to tune the input signal of the ADC 62. FIG. 13(B) shows the branch eigenvalues with too small AGC gain. As shown in FIG. 13(A), since the gain is too large, the seventh eigenvalue EV_g is greater than "+MSB" and the eighth eigenvalue EV_h is smaller than "−MSB". As shown in FIG. 13(B), since the gain is too small, the seventh eigenvalue EV_g is smaller than "+MSB" and the eighth eigenvalue EV_h is greater than "−MSB". Therefore, the difference of (EV_g−EV_h) and (2*MSB) are referred to tune the gain. The gain control unit 86 receives the difference (EV_g−EV_h) between the seventh eigenvalue EV_g and the eighth eigenvalue EV_h, and compares the difference (EV_g−EV_h) with (2*MSB) to generate the gain control value. The gain control value is further converted into an analog signal by the second DAC 87 to control the gain of the AGC 90.

Figure 14B:
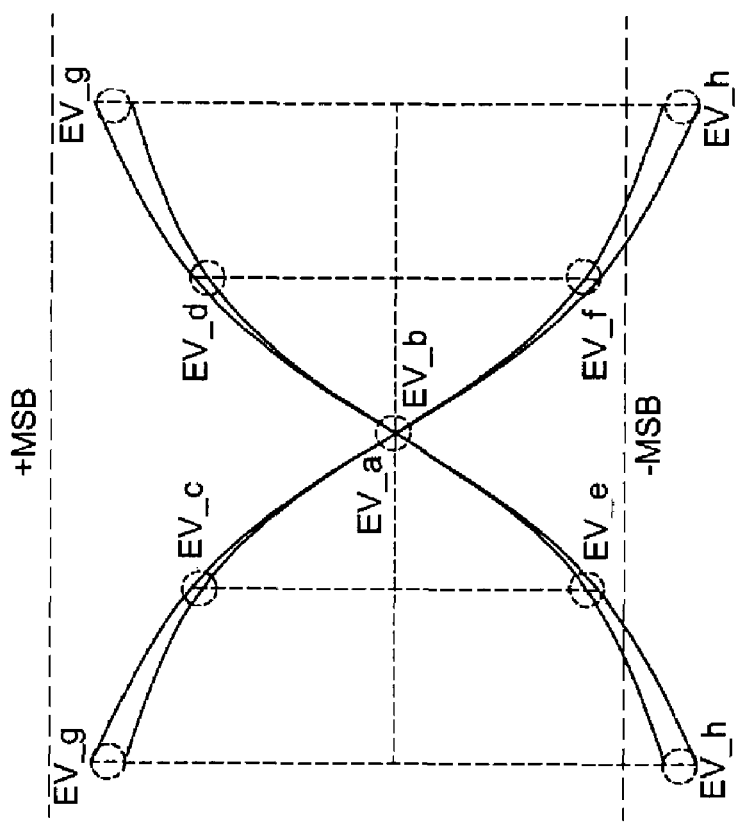
FIG. 14(B) shows the branch eigenvalues with too low AGC offset.
Figure 14A:
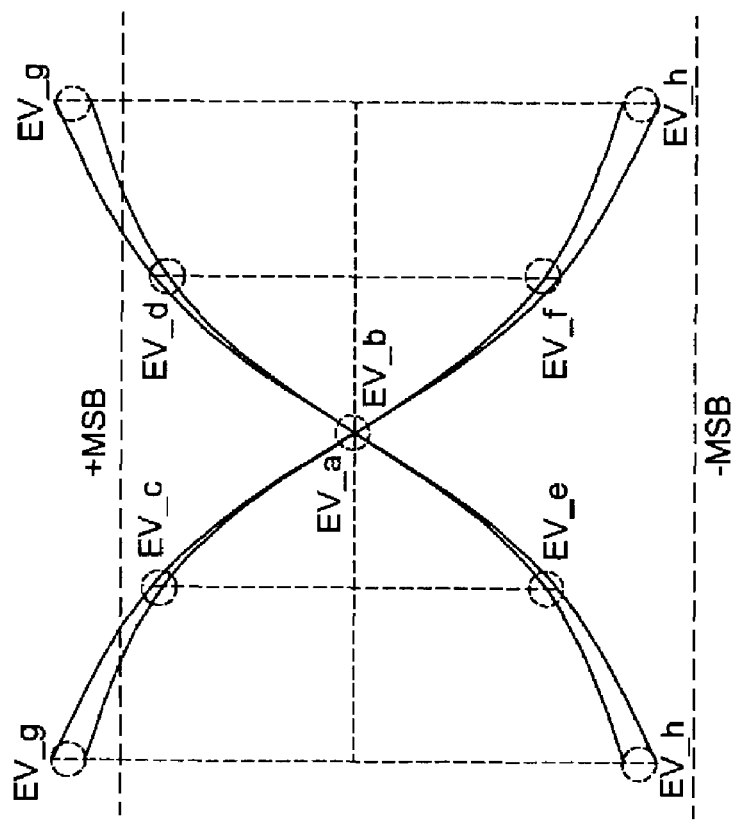
FIG. 14(A) shows the branch eigenvalues with too high AGC offset.

Furthermore, the PRML system 80 with a branch estimator of the invention may further use the offset control unit 88 and the third DAC 89 to control the offset of the AGC 90, so as to tune the offset of the input signal of ADC 62 to a predetermined range. FIG. 14(A) shows the branch eigenvalues with too high AGC offset and FIG. 14(B) shows the branch eigenvalues with too low AGC offset. As showing in FIG. 14(A), when the offset is too high, the average value ((EV_g+EV_h)/2) of the seventh eigenvalue EV_g and eighth eigenvalue EV_h is positive. As showing in FIG. 14(B), when the offset is too low, the average value ((EV_g+EV_h)/2) of the seventh eigenvalue EV_g and eighth eigenvalue EV_h is negative. Therefore, the average value ((EV_g+EV_h)/2) of the seventh eigenvalue EV_g and eighth eigenvalue EV_h is referred to tune the offset. The offset control unit 88 receives the average value ((EV_g+EV_h)/2) of the seventh eigenvalue EV_g and the eighth eigenvalue EV_h to generate an offset control value. Then, the third DAC 89 converts the offset control value into an analog signal to control the offset of the AGC 90.

Since the invention employs a branch estimator, the hardware cost is lowered and the speed is increased. Furthermore, since the invention is trellis-directed, it is applicable to non-linear channels.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A PRML (partial response maximum likelihood) system, comprising:
   an analog-to-digital converter for receiving an analog input signal, and converting the analog input signal into a digital sampled signal according to a sampling clock;
   a branch estimator for receiving the digital sampled signal and estimating a plurality of branch eigenvalues; and
   a decoder for receiving the digital sampled signal and the plurality of branch eigenvalues and decoding the digital sampled signal to generate an output signal.

2. The PRML system according to claim 1, wherein the branch estimator comprises:
   a plurality of branch eigenvalue calculating units for calculating the branch eigenvalues; and
   a de-multiplexer for receiving the data of the digital sampled signal and outputting the data to one of the branch eigenvalue calculating units.

3. The PRML system according to claim 2, wherein each branch eigenvalue calculating unit calculates the branch eigenvalue by calculating a weighted sum of the received data from the de-multiplexer.

4. The PRML system according to claim 3, wherein the de-multiplexer further receives the branch eigenvalues and outputs the data of the digital sampled signal to one of the branch eigenvalue calculating units according to the value of the digital sampled signal and the increasing/decreasing trend of the digital sampled signal and the branch eigenvalues.

5. The PRML system according to claim 3, wherein the de-multiplexer further receives the output signal of the decoder and outputs the data of the digital sampled signal to one of the branch eigenvalue calculating units according to the output signal of the decoder.

6. The PRML system according to claim 1, wherein the decoder is a Viterbi decoder.

7. The PRML system according to claim 6, wherein decoding parameters of the Viterbi decoder are adjustable.

8. The PRML system according to claim 6, wherein each branch eigenvalue estimated by the branch estimator is with respect to one transition between two states in the trellis of the Viterbi decoder.

9. The PRML system according to claim 8, wherein the branch estimator generates two branch eigenvalues including:
   a first eigenvalue, when the digital sampled signal is decreasing gradually to about 0; and
   a second eigenvalue, when the digital sampled signal is increasing gradually to about 0.

10. The PRML system according to claim 9, further comprising a comparator to convert the analog input signal into a binary signal by comparing the analog input signal with a slicing level generated from the average value of the first eigenvalue and the second eigenvalue.

11. The PRML system according to claim 9, further comprising:
    a timing control unit for receiving a difference between the first eigenvalue and the second eigenvalue, and generating a timing control signal; and
    a clock phase adjusting unit for receiving the timing control signal and adjust the phase of the sampling clock to the analog-to-digital converter.

12. The PRML system according to claim 8, wherein the branch estimator generates four branch eigenvalues including:
    a third eigenvalue, when the digital sampled signal is decreasing gradually to about ½ positive peak value;
    a fourth eigenvalue, when the digital sampled signal is increasing gradually to about ½ positive peak value;
    a fifth eigenvalue, when the digital sampled signal is decreasing gradually to about ½ negative peak value; and
    a sixth eigenvalue, when the digital sampled signal is increasing gradually to about ½ negative peak value.

13. The PRML system according to claim 8, wherein the branch estimator further generates two branch eigenvalues including:
    a seventh eigenvalue, when the digital sampled signal is about positive peak value; and
    an eighth eigenvalue, when the digital sampled signal is about negative peak value.

14. The PRML system according to claim 13, further comprising an gain amplifier arranged in front of the analog-to-digital converter to control the amplitude and offset of the analog input signal according to a gain control signal and a offset control signal.

15. The PRML system according to claim 14, further comprising
    a gain control unit for generating the gain control signal according to the difference between the seventh eigenvalue and the eighth eigenvalue.

16. The PRML system according to claim 14, further comprising
an offset control unit for generating the offset control signal according to an average value of the seventh eigenvalue and the eighth eigenvalue.

17. The PRML system according to claim 8, wherein the branch estimator generates two branch eigenvalues including:
a first eigenvalue, related to an average value of the digital sampled signal at the center of the falling transition duration of the digital sampled signal; and
a second eigenvalue, related to an average value of the digital sampled signal at the center of the rising transition duration of the digital sampled signal.

18. The PRML system according to claim 17, further comprising:
a timing control unit for receiving a difference between the first eigenvalue and the second eigenvalue, and generating a timing control signal; and
a clock phase adjusting unit for receiving the timing control signal and adjust the phase of the sampling clock to the analog-to-digital converter.

19. The PRML system according to claim 8, wherein the branch estimator generates four branch eigenvalues including:
a third eigenvalue, related to an average value of the digital sampled signal earlier a period of the sampling clock than the center of the falling transition duration of the digital sampled signal;
a fourth eigenvalue, related to an average value of the digital sampled signal later a period of the sampling clock than the center of the rising transition duration of the digital sampled signal;
a fifth eigenvalue, related to an average value of the digital sampled signal later a period of the sampling clock than the center of the falling transition duration of the digital sampled signal; and
a sixth eigenvalue, related to an average value of the digital sampled signal earlier a period of the sampling clock than the center of the rising transition duration of the digital sampled signal.

20. The PRML system according to claim 8, wherein the branch estimator generates two branch eigenvalues including:
a seventh eigenvalue, related to an average value of the digital sampled signal later two periods of the sampling clock than the center of the rising transition duration of the digital sampled signal or the digital sampled signal earlier two periods of the sampling clock than the center of the falling transition duration of the digital sampled signal; and
an eighth eigenvalue, related to an average value of the digital sampled signal later two periods of the sampling clock than the center of the falling transition duration of the digital sampled signal or the digital sampled signal earlier two periods of the sampling clock than the center of the rising transition duration of the digital sampled signal.

21. The PRML system according to claim 20, further comprising an gain amplifier arranged in front of the analog-to-digital converter to control the amplitude and offset of the analog input signal according to a gain control signal and a offset control signal.

22. The PRML system according to claim 21, further comprising:
a gain control unit for generating the gain control signal according to the difference between the seventh eigenvalue and the eighth eigenvalue.

23. The PRML system according to claim 21, further comprising:
an offset control unit for generating the offset control signal according to an average value of the seventh eigenvalue and the eighth eigenvalue.

* * * * *